United States Patent
Kang et al.

(10) Patent No.: US 8,589,767 B2
(45) Date of Patent: Nov. 19, 2013

(54) SYSTEMS, DEVICES AND METHODS USING REDUNDANT ERROR CORRECTION CODE BIT STORAGE

(75) Inventors: Sang Beom Kang, Hwasung-si (KR); Chul Woo Park, Yongin-si (KR); Hyun Ho Choi, Suwon-si (KR); Ho Jung Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 598 days.

(21) Appl. No.: 12/713,853

(22) Filed: Feb. 26, 2010

(65) Prior Publication Data

US 2010/0223532 A1 Sep. 2, 2010

(30) Foreign Application Priority Data

Mar. 2, 2009 (KR) ........................ 10-2009-0017707

(51) Int. Cl.
*G11C 29/00* (2006.01)

(52) U.S. Cl.
USPC .......................................... 714/766; 714/797

(58) Field of Classification Search
USPC ......... 714/766, 773, 746, 797, 823, 718, 763, 714/710, 799; 365/185.33, 230.03, 200, 365/201
See application file for complete search history.

(56) References Cited

U.S. PATENT DOCUMENTS

| | | | | |
|---|---|---|---|---|
| 4,680,975 A * | 7/1987 | Dodt | ........................ | 73/862.09 |
| 6,289,481 B1 * | 9/2001 | Egawa | ........................ | 714/746 |
| 6,618,831 B2 * | 9/2003 | Lippincott | ................... | 714/752 |
| 6,662,333 B1 * | 12/2003 | Zhang et al. | ................... | 714/767 |
| 6,934,203 B2 * | 8/2005 | Choi | ............................ | 365/200 |
| 7,069,494 B2 * | 6/2006 | Cargnoni et al. | ............. | 714/763 |
| 7,296,213 B2 * | 11/2007 | Vainsencher et al. | ......... | 714/784 |
| 7,389,465 B2 * | 6/2008 | Radke et al. | .................... | 714/755 |
| 7,428,161 B2 * | 9/2008 | Kanda | ............................ | 365/63 |
| 7,568,146 B2 * | 7/2009 | Takahashi et al. | ............ | 714/763 |
| 7,681,109 B2 * | 3/2010 | Litsyn et al. | .................... | 714/773 |
| 7,826,263 B2 * | 11/2010 | Lee et al. | ................. | 365/185.09 |
| 7,930,612 B2 * | 4/2011 | Radke et al. | .................... | 714/755 |
| 8,151,163 B2 * | 4/2012 | Shalvi et al. | ................... | 714/758 |
| 8,261,157 B2 * | 9/2012 | Litsyn et al. | .................... | 714/763 |
| 2004/0228182 A1 * | 11/2004 | Choi | ............................ | 365/200 |
| 2006/0156196 A1 * | 7/2006 | Takahashi et al. | ............ | 714/766 |
| 2006/0227596 A1 | 10/2006 | Thayer | | |
| 2007/0121359 A1 * | 5/2007 | Kanda | ............................ | 365/51 |
| 2008/0008001 A1 * | 1/2008 | Kuroyanagi | ............. | 365/185.11 |
| 2009/0183049 A1 * | 7/2009 | Litsyn et al. | ................... | 714/752 |
| 2009/0217131 A1 * | 8/2009 | Litsyn et al. | ................... | 714/752 |
| 2011/0026326 A1 * | 2/2011 | Lee et al. | ................. | 365/185.09 |
| 2012/0159281 A1 * | 6/2012 | Shalvi et al. | ................... | 714/755 |
| 2012/0173956 A1 * | 7/2012 | Jeon et al. | ...................... | 714/773 |

FOREIGN PATENT DOCUMENTS

| | | | |
|---|---|---|---|
| KR | 1020050027216 A | 3/2005 | |
| KR | 1020080086152 A | 9/2008 | |

* cited by examiner

*Primary Examiner* — Phung M Chung
(74) *Attorney, Agent, or Firm* — Myers Bigel Sibley & Sajovec, P.A.

(57) ABSTRACT

A device, e.g., a semiconductor memory device, includes a plurality of memory cells, each configured to store at least one data bit and a plurality of error correction code (ECC) cells configured to redundantly store ECC bits for the memory cells. According to some embodiments, the plurality of ECC cells includes a plurality of pairs of ECC cells configured to store an ECC bit and a complement thereof. According to further embodiments, the plurality of ECC cells includes a plurality of groups of at least three ECC cells configured to store identical copies of an ECC bit.

8 Claims, 13 Drawing Sheets

FIG. 12
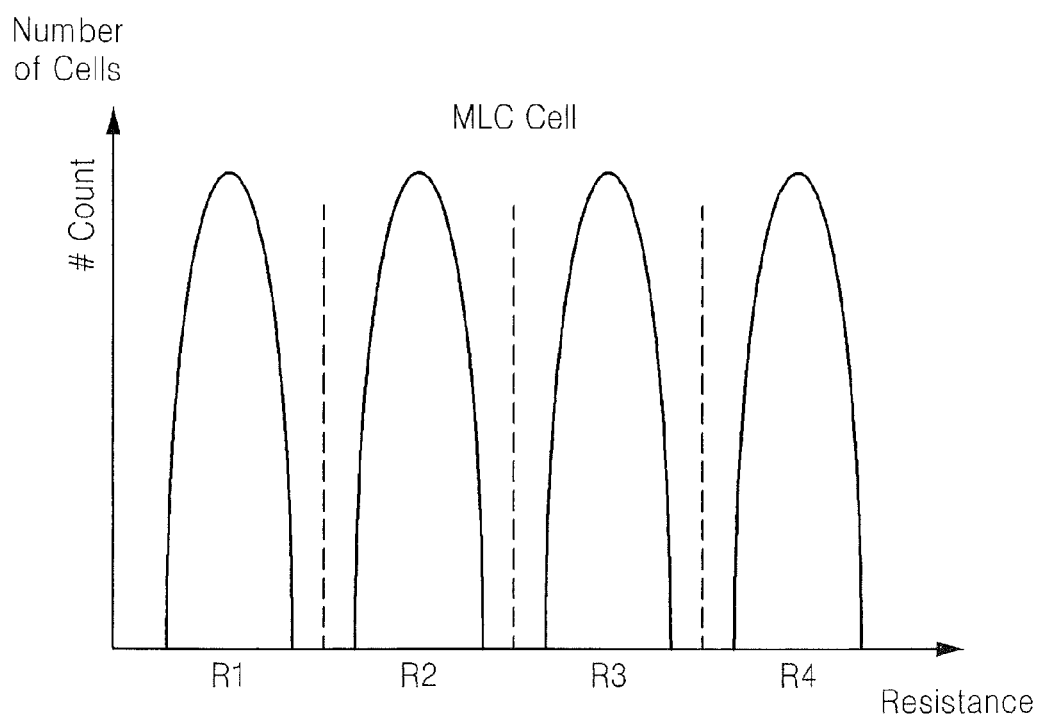
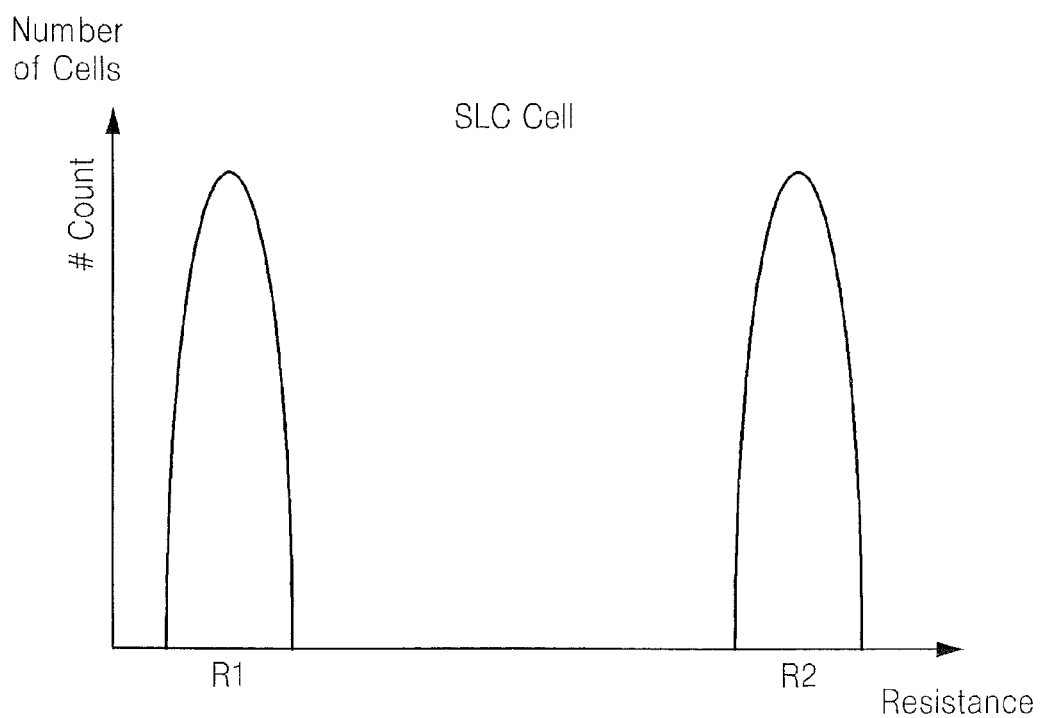

SYSTEMS, DEVICES AND METHODS USING REDUNDANT ERROR CORRECTION CODE BIT STORAGE

CROSS-REFERENCE TO RELATED APPLICATIONS

This application claims priority under 35 U.S.C. §119 to Korean Patent Application No. 10-2009-0017707, filed Mar. 2, 2009, in the Korean Intellectual Property Office, the disclosure of which is incorporated herein in its entirety by reference.

BACKGROUND

The present invention relates to semiconductor memory and, more particularly, to semiconductor memory with error correction coding (ECC) capabilities.

Memory configured for mass storage often uses error correction coding (ECC) to increase reliability of data storage. Commonly, data bits and ECC bits are stored together in a memory cell array. If at least one of the ECC bits is damaged, however, error correction operations of the devices may be invalid.

SUMMARY

In some embodiments of the present invention, a device includes a plurality of memory cells, each configured to store at least one data bit and a plurality of error correction code (ECC) cells configured to redundantly store ECC bits for the memory cells. According to some embodiments, the plurality of ECC cells includes a plurality of pairs of ECC cells configured to store an ECC bit and a complement thereof. A memory cell and a pair of ECC cells corresponding thereto may be connected to the same word line. The device may include a read circuit configured to simultaneously read complementary bits from a pair of ECC cells to generate a single ECC signal. The device may further include a write circuit configured to sequentially write complementary bits to a pair of ECC cells.

In some embodiments, a first one of a given pair of ECC cells is connected to a first bit line and second one of the given pair of ECC cells is connected to a second bit line. The device further includes a sense amplifier circuit, a first switching circuit configured to connect and disconnect the first bit line to and from a first input terminal of the differential amplifier in response to a first switching signal, second switching circuit configured to connect and disconnect the second bit line to and from a second input terminal of the differential amplifier in response to a second switching signal, a first write driver circuit connected to the first input terminal and a second write driver circuit connected to the second input terminal.

According to further embodiments of the present invention, the plurality of ECC cells includes a plurality of groups of at least three ECC cells configured to store identical copies of an ECC bit. The device may further include a determination logic circuit configured to generate respective ECC outputs from respective ones of the groups of at least three ECC cells according to a majority voting logic.

Additional embodiments of the present invention provide a device including a plurality of memory cells, each of which is configured to store multiple-bit data and a plurality of ECC cells, each configured to store single bit ECC data for the memory cells.

In still further embodiments, a system includes a processor configured to produce a data bit and an ECC bit corresponding to the data bit and a memory coupled to the processor and including a memory cell configured to store the data bit and a plurality of ECC cells configured to redundantly store the ECC bit. The plurality of ECC cells may include a pair of ECC cells configured to store the ECC bit and a complement thereof. In some embodiments, the plurality of ECC cells includes a group of at least three ECC cells configured to identical copies of the ECC bit.

Additional embodiments of the present invention provide methods including storing a data bit in a memory cell of a memory and redundantly storing an ECC bit corresponding to the data bit in a plurality of ECC cells of the memory. In some embodiments, redundantly storing an ECC bit corresponding to the data bit in a plurality of ECC cells of the memory may include storing the ECC bit and a complement thereof in a pair of ECC cells of the memory. In further embodiments, redundantly storing the ECC bit corresponding to the data bit in a plurality of ECC cells of the memory may include storing identical copies of the ECC bit in a group of at least three ECC cells of the memory.

BRIEF DESCRIPTION OF THE DRAWINGS

Exemplary embodiments of the present invention will be more clearly understood from the following detailed description taken in conjunction with the accompanying drawings in which:

FIG. 12 includes graphs showing distributions of the number of cells versus resistance of a memory cell included in the semiconductor device illustrated in FIG. 11.

DETAILED DESCRIPTION OF THE EMBODIMENTS

Some embodiments of the present invention will now be described hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like items throughout.

It will be understood that when an item is referred to as being "connected" or "coupled" to another item, it can be directly connected or coupled to the other item or intervening items may be present. In contrast, when an item is referred to as being "directly connected" or "directly coupled" to another item, there are no intervening items present. As used herein, the term "and/or" includes any and all combinations of one or more of the associated listed items and may be abbreviated as "/".

It will be understood that, although the terms first, second, etc. may be used herein to describe various items, these items should not be limited by these terms. These terms are only used to distinguish one item from another. For example, a "first" item could be termed a "second" item, and, similarly, a "second" item could be termed a "first" item without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated items or operations but do not preclude the presence or addition of one or more other items or operations.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
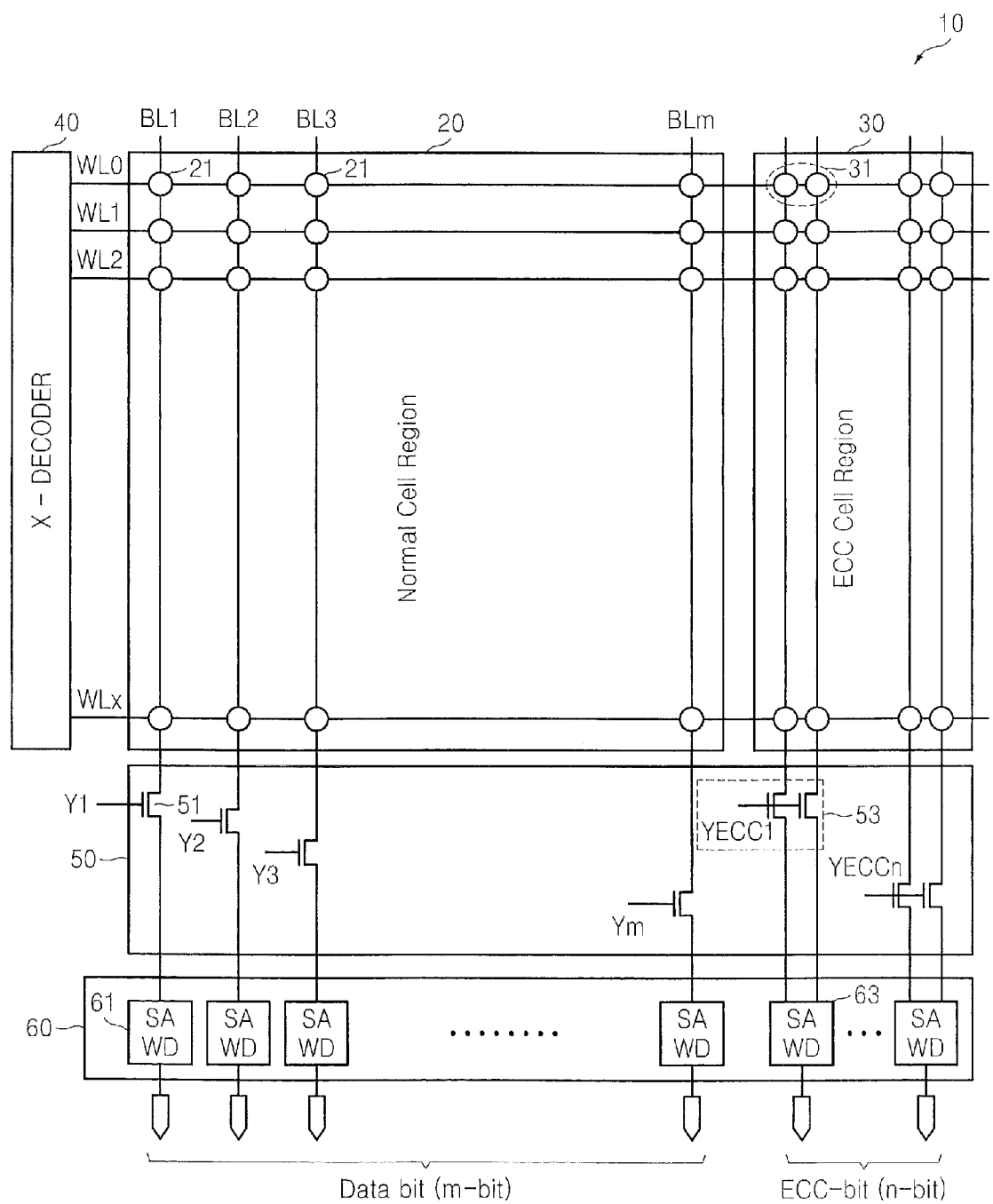
FIG. 1 is a block diagram of a semiconductor device according to some embodiments of the present invention.

FIG. 1 is a block diagram of a semiconductor device 10 according to some embodiments of the present invention. The semiconductor device 10 may include a normal cell region 20, an error correction code (ECC) cell region 30, a row decoder 40, a column decoder 50, and an access block 60. The normal cell region 20 may include a plurality of wordlines, namely, first through x-th wordlines WL0 through WLx (where x denotes a natural number), a plurality of bit lines BL1 through BLm (where m denotes a natural number), and a plurality of memory cells 21 (hereinafter, referred to as data cells). The plurality of data cells 21 may be connected to the wordlines WL0 through WLx and the bit lines BL1 through BLm, respectively. Each of the normal cell region 20 and the ECC cell region 30 may have a two-dimensional or three-dimensional structure. The plurality of data cells 21 may store data or data bits. The plurality of data cells 21 may store data in units of pages. For example, the plurality of data cells 21 may store data in units of 512 bytes, 1024 bytes, or 2048 bytes. Alternatively, the plurality of data cells 21 may store data in units of an integral multiple of 512 bytes.

Each of memory cells 21 may be non-volatile memory cells, such as EEPROM cells, flash memory cells, magnetic RAM (MRAM) cells, Spin-Transfer Torque MRAM cells, conductive bridging RAM (CBRAM) cells, ferroelectric RAM (FeRAM) cells, phase change RAM (PRAM) cells (also called Ovonic Unified Memory (OUM)), resistive RAM (RRAM or ReRAM) cells, nanotube RRAM cells, polymer RAM (PoRAM) cells, Nano Floating Gate Memory (NFGM) cells, holographic memory cells, Molecular Electronics Memory Device (MEMD) cells, or Insulator Resistance Change Memory (IRCM) cells. The non-volatile memory cells 21 may store a single bit or a plurality of bits, e.g., the non-volatile memory cells 21 may be implemented as single level cells (SLC) or multi level cells (MLC).

To increase the reliability of ECCs or ECC bits, the ECC cell region 30 may include a plurality of memory cell pairs 31 (hereinafter, referred to as ECC memory cell pairs). Each ECC memory cell pair may be referred to as a twin cell. In other words, the ECC cell region 30 may include a plurality of ECC memory cell pairs 31. For example, if m-bit data is written (or programmed) to m data cells 21 which are connected to, for example, the first wordline WL0, and disposed in the normal cell region 20, an n-bit ECC corresponding to the m-bit data may be written (or programmed) to n ECC memory cell pairs 31 which are connected to the first wordline WL0 and disposed in the ECC cell region 30.

Writing (or programming) of a 1-bit ECC to an ECC memory cell pair 31 denotes writing of complementary data to two first and second ECC memory cells (for example, R1 and R2 of FIG. 2 or R3 and R4 of FIG. 3) that constitute the ECC memory cell pair 31. Thus, one of data "0" and data "1" may be written to the first ECC memory cell (for example, R1 of FIG. 2 or R3 of FIG. 3) of the ECC memory cell pair 31, and the other of data "0" and "1" may be written to the second ECC memory cell (for example, R2 of FIG. 2 or R4 of FIG. 3) of the ECC memory cell pair 31. In other words, each of a plurality of ECC bits corresponding to a plurality of data bits may be written (or programmed) as complementary data to each ECC memory cell pair 31.

The row decoder 40 may select one from the first through x-th wordlines WL0 through WLx in response to a row address received from an external source. The column decoder 50 may select one from the bit lines BL1 through BLm in response to a column address received from an external source. Therefore, at least one of the data cells 21 disposed in the normal cell region 20 and/or at least one of the ECC memory cell pair 31 disposed in the ECC cell region 30 may be selected by the row decoder 40 and the column decoder 50. In some embodiments, two ECC memory cells that constitute each ECC memory cell pair 31 may be sequentially selected, for example, during a write or program operation, or simultaneously selected, for example, during a read operation.

During an access operation, the column decoder 50 may connect/disconnect each of a plurality of bit lines disposed in the normal cell region 20 and the ECC cell region 30 to/from each of a plurality of access units 61 and 63 in response to a corresponding switching signal from among a plurality of switching signals Y1 through Ym and a plurality of switching signals YECC1 through YECCn.

The column decoder 50 may include a plurality of first type switching circuits 51 and a plurality of second type switching circuits 53. The access block 60 may access the data cells 21 of the normal cell region 20 and the ECC memory cell pairs 31 of the ECC cell region 30 during an access operation, for example, a program operation, a write operation, a read operation, or an erase operation. For example, if data corresponding to a single page (hereinafter, referred to as single page data) is written to the data cells 21 which are connected to the first wordline WL0 and disposed in the normal cell region 20 during a write operation, the semiconductor device 10 may simultaneously or sequentially write the single page data to the data cells 21 according to the amount of consumed current by using the column decoder 50. The sequential writing may denote application of a write voltage to at least one bit line.

If single page data is read from the data cells 21 which are connected to the first wordline WL0 and disposed in the normal cell region 20 during a read operation, the semiconductor device 10 may simultaneously or sequentially read the single page data from the data cells 21 according to the amount of consumed current by using the column decoder 50. The sequential reading may denote application of a read voltage to at least one bit line.

The access block 60 may include the plurality of first type access units 61 and the plurality of second type access units 63. Here, the access unit may denote a write circuit and/or a read circuit. An operation and structure of each first type access unit 61 will be described in detail with reference to FIGS. 4 and 5, and an operation and structure of each second type access unit 63 will be described in detail with reference to FIGS. 6 and 7.

Figure 2:
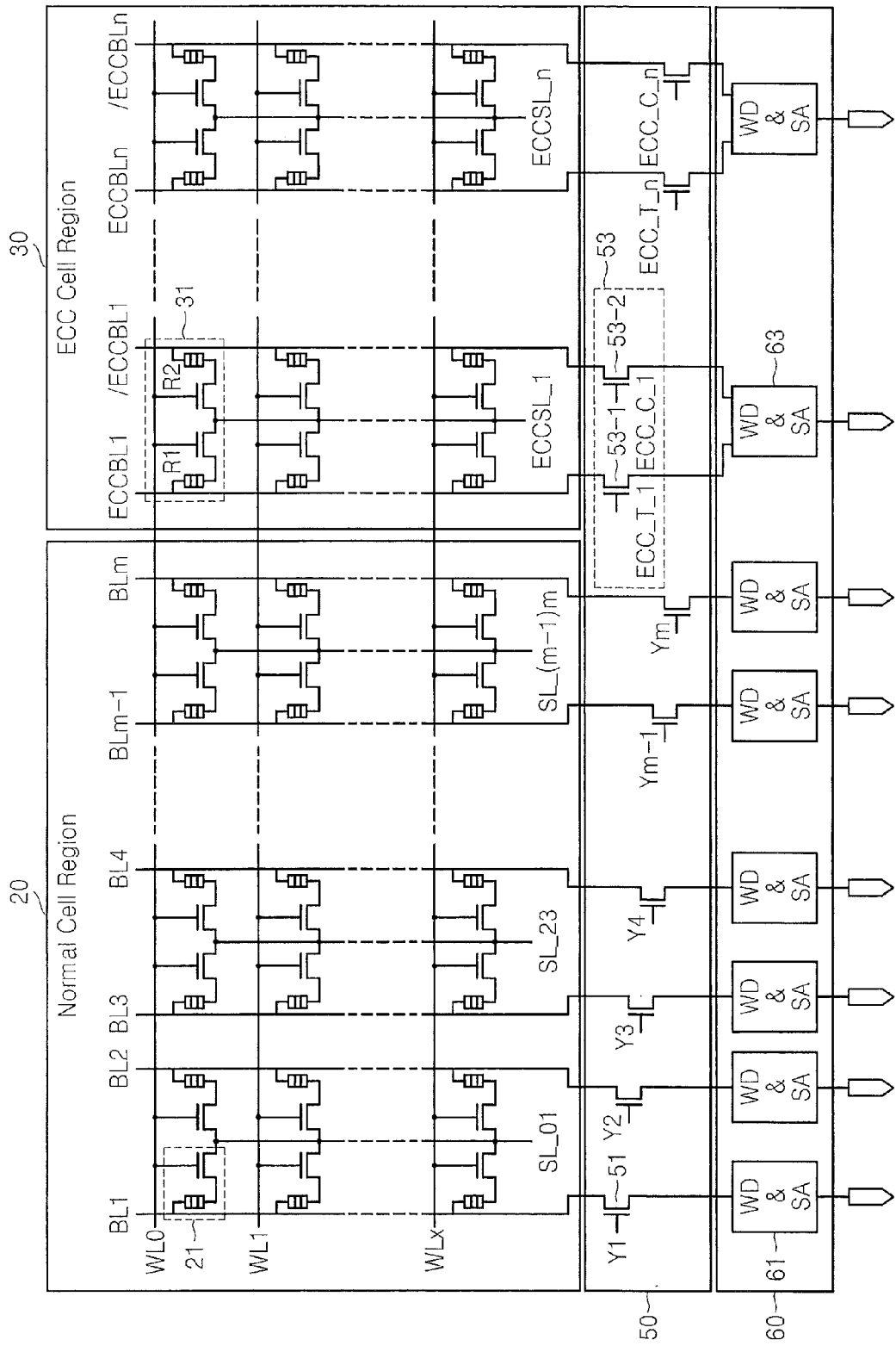
FIG. 2 is a block diagram of a semiconductor device according to further embodiments of the present invention.

FIG. 2 is a block diagram of some embodiments of the semiconductor device 10 illustrated in FIG. 1. In FIG. 2, illustrating a case where a MOSFET is used as a memory cell selection device, each of the normal cell region 20 and the ECC cell region 30 may be a transistor cell type array. As illustrated in FIG. 2, each ECC memory cell pair 31 for storing each ECC bit may include two MOSFETs and two data storage devices R1 and R2, for example, ReRAMs. The two data storage devices R1 and R2 may store complementary ECC bits (for example, complementary signals or differential signals).

Each second type switching circuit 53 may include two switches 53-1 and 53-2 for connecting/disconnecting the two data storage devices R1 and R2 to/from a corresponding second type access unit 63. During a read operation, the two switches 53-1 and 53-2 may simultaneously transmit the complementary ECC bits stored in the ECC memory cell pair 31 to the second type access unit 63 in response to simultaneously enabled switching signals ECC_T_1 and ECC_C_1. Therefore, the second type access unit 63, which may be implemented as a differential amplifier, may amplify a difference between the complementary ECC bits and output a signal corresponding to the amplified difference as a read-out ECC bit.

During a write operation, the two switches 53-1 and 53-2 may write the complementary ECC bits to the ECC memory cell pair 31 in response to the switching signals ECC_T_1 and ECC_C_1 which are sequentially enabled.

A write operation will now be described with reference to FIG. 2. To write data "0" to at least one of the plurality of data cells 21 disposed in the normal cell region 20 and at least one of the ECC memory cell pairs 31 disposed in the ECC cell region 30, the semiconductor device 10 may select at least one desired bit line by using the column decoder 50.

The column decoder 50 may apply a write voltage supplied from the access block 60 to the selected at least one desired bit line. A power supply circuit (not shown) may apply a ground voltage to at least one line selected from a plurality of lines SL_01 through SL_(m−1)m disposed in the normal cell region 20 and at least one line selected from a plurality of lines ECCSL_1 through ECCSL_n disposed in the ECC cell region 30. Thus, the data "0" may be written to the at least one data cell 21 and the at least one ECC memory cell.

To write data "1" to at least one of the plurality of data cells 21 disposed in the normal cell region 20 and at least one of the ECC memory cell pairs 31 disposed in the ECC cell region 30, the semiconductor device 10 may select at least one desired bit line by using the column decoder 50.

The column decoder 50 may apply a ground voltage supplied from the access block 60 to the selected at least one bit line. The power supply circuit may apply a write voltage to at least one line selected from the lines SL_01 through SL_(m−1)m disposed in the normal cell region 20 and at least one line selected from the lines ECCSL_1 through ECCSL_n disposed in the ECC cell region 30. Thus, the data "1" may be written to the at least one data cell 21 and the at least one ECC memory cell.

A read operation will now be described with reference to FIG. 2. The access block 60 applies a read voltage to all bit lines from which data is to be read via the column decoder 50, and the power supply circuit applies a ground voltage to all of the lines SL_01 through SL_(m−1)m and all of the lines ECCSL_1 through ECCSL_n. Data output from the normal cell region 20 is sense amplified by the plurality of first type access units 61. ECC bits output from the ECC cell region 30 are sense amplified by the plurality of second type access units 63.

Figure 3:
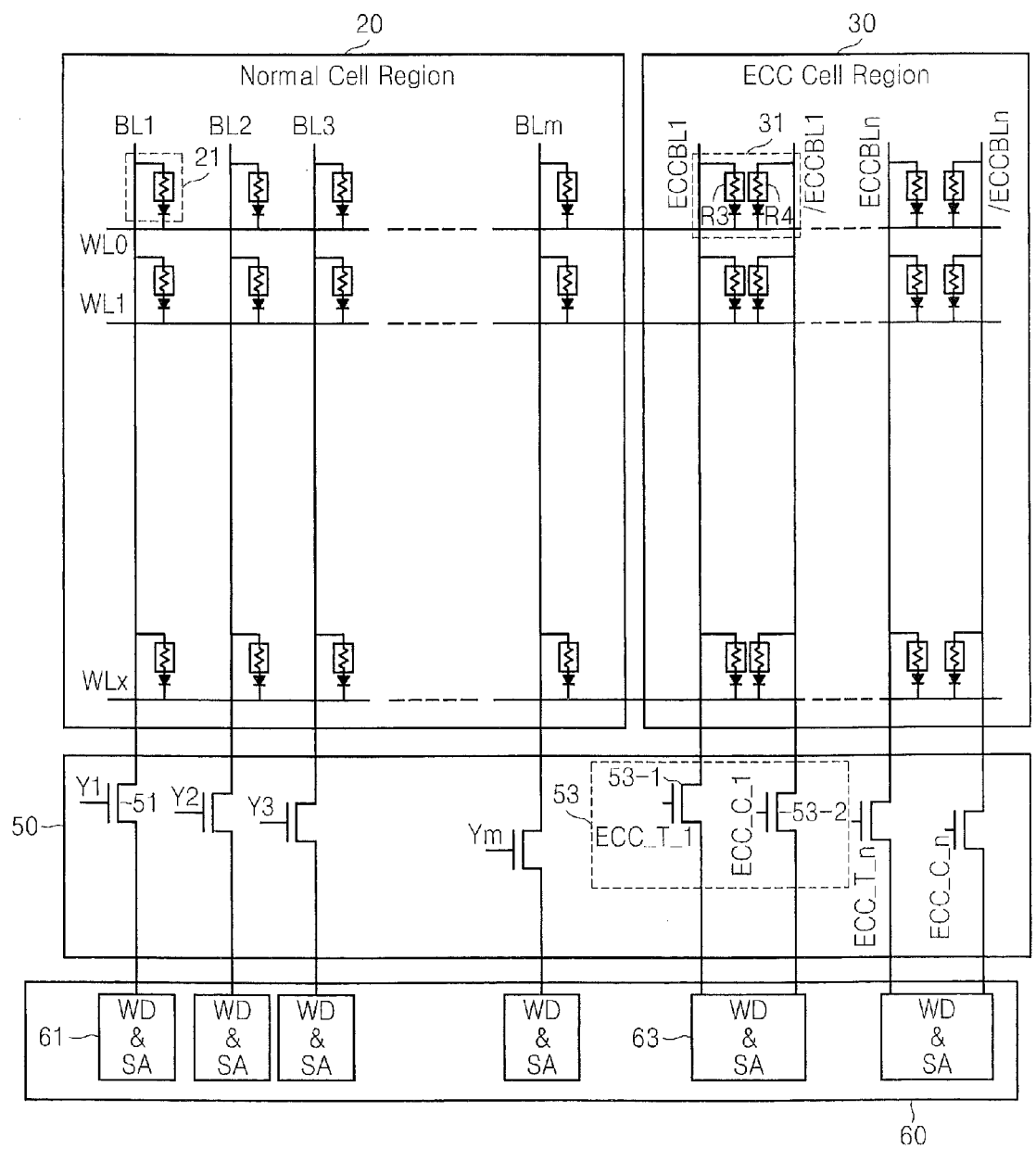
FIG. 3 is a block diagram of a semiconductor device according to some embodiments of the present invention.

FIG. 3 is a block diagram of some embodiments of the semiconductor device 10 illustrated in FIG. 1. In FIG. 3, illustrating a case where a diode is used as a memory cell selection device, each of the normal cell region 20 and the ECC cell region 30 may form a cross point array.

An operation of writing data to a data cell will now be described with reference to FIGS. 1 and 3. The semiconductor device 10 may select a wordline and bit lines connected to cells to which the data "1" is to be written from among the data cells 21 and the ECC memory cells, by using the row decoder 40 and the column decoder 50, apply a ground voltage to the selected wordline by using the row decoder 40, and apply a first write voltage, for example, a pulse type signal, to the selected bit lines by using the column decoder 50. If the data cells 21 and the ECC memory cells are PRAMs, the first write voltage may be a relatively narrow pulse with a high level.

The semiconductor device 10 may select a wordline and bit lines connected to cells to which the data "0" is to be written from among the data cells 21 and the ECC memory cells, by using the row decoder 40 and the column decoder 50, apply a ground voltage to the selected wordline by using the row decoder 40, and apply a second write voltage, for example, a pulse signal, to the selected bit lines by using the column decoder 50. If the data cells 21 and the ECC memory cells are PRAMs, the second write voltage may be a relatively wide pulse with a low level.

An operation for complementarily writing each ECC bit to each ECC memory cell pair 31 will now be described in greater detail with reference to FIGS. 1 and 3. The semiconductor device 10 sequentially write complementary data to the ECC memory cells R3 and R4 of the ECC memory cell pair 31 by using the second type access unit 63. For example, the semiconductor device 10 transmits one selected from the data "0" and the data "1" output via the enabled second type access unit 63 to a bit line ECCBL1 and writes the selected data "0" or "1" to an ECC memory cell (for example, R3) connected between the bit line ECCBL1 and a wordline. Thereafter, the semiconductor device 10 transmits the other data "0" or "1" to a complementary bit line/ECCBL1 and writes the other data "0" or "1" to an ECC memory cell (for example, R4) connected between the complementary bit line/ECCBL1 and a wordline.

The semiconductor device 10 may write each ECC bit as complementary data to each ECC memory cell pair 31 by using a process the same as or similar to the above-described process.

A read operation will now be described with reference to FIGS. 1 and 3. The semiconductor device 10 simultaneously or sequentially transmits data output from the data cells 21 to the first type access units 61 by using the first type switching circuits 51, respectively. The first type switching circuits 51 may be turned on/off according to the levels of switching signals Y1 through Ym. The semiconductor device 10 simultaneously transmits complementary ECC bits output from the ECC memory cell pairs 31 to the second type access units 63 by using the second type switching circuits 53, respectively. The second type switching circuits 53 may be turned on/off according to the levels of the switching signals ECC_T_1 through ECC_T_n and ECC_C_1 through ECC_C_n.

Figure 4:
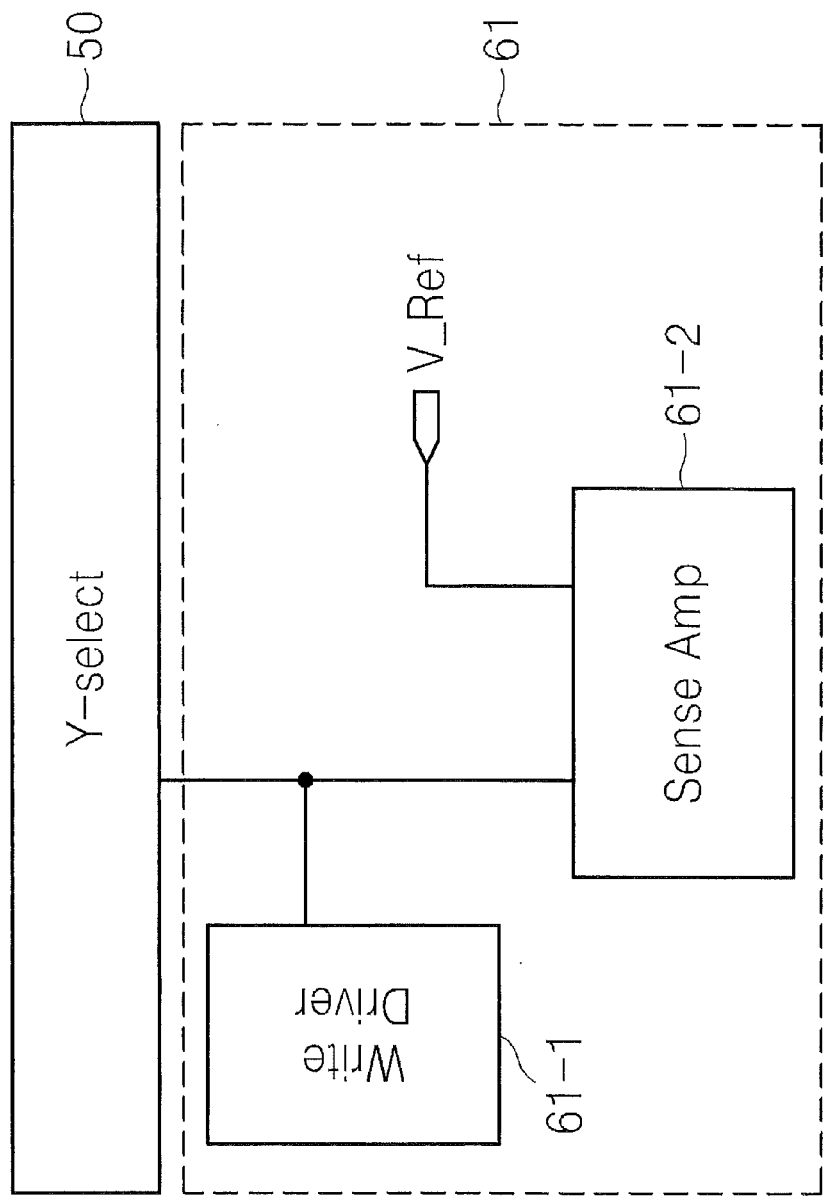
FIG. 4 is a block diagram of an access unit for the semiconductor device illustrated in FIG. 1 according to some embodiments of the present invention.
Figure 5:
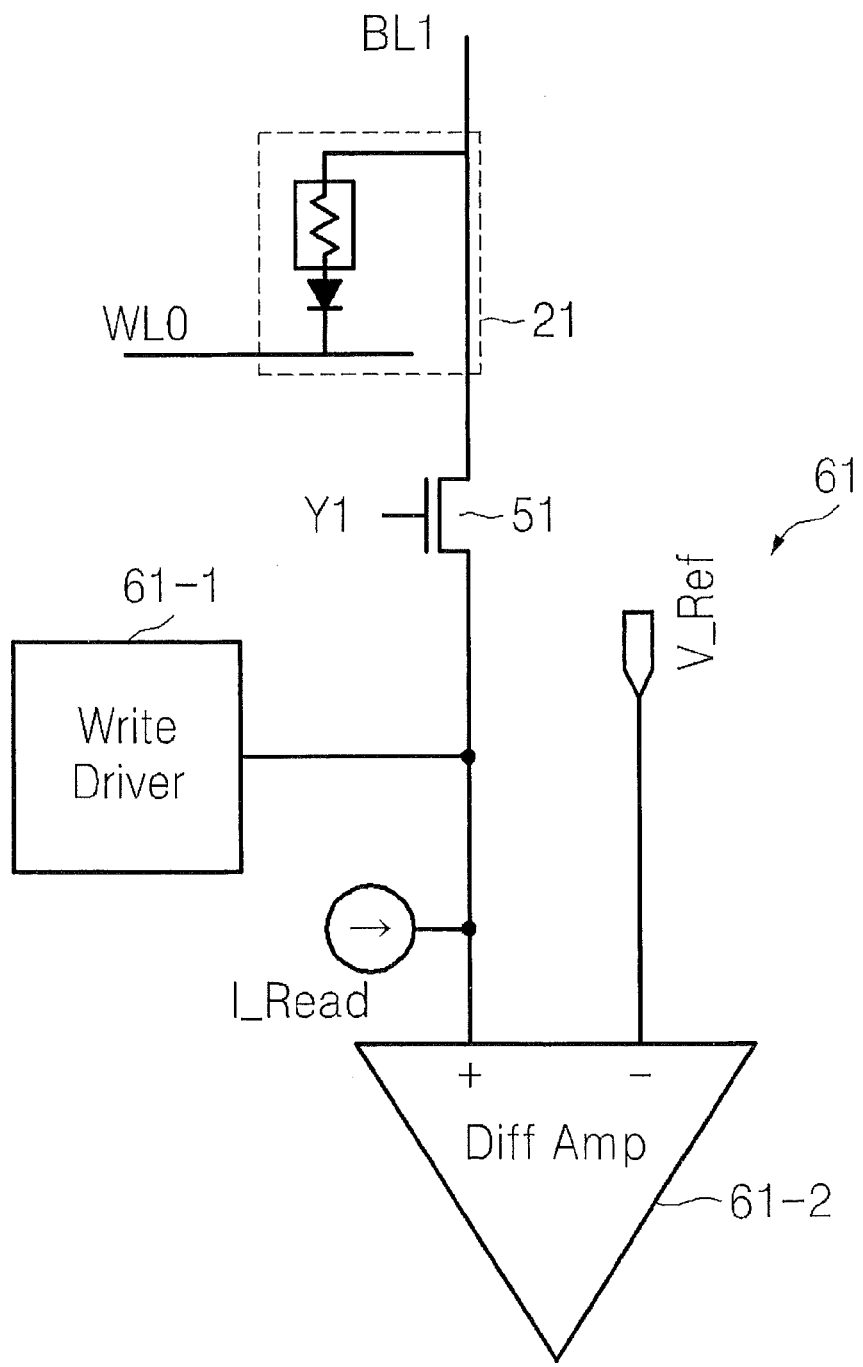
FIG. 5 is a diagram of a circuit implementation of the access unit illustrated in FIG. 4 according to some embodiments of the present invention.

FIG. 4 is a block diagram of each first type access unit 61 illustrated in FIG. 1. FIG. 5 is a circuit diagram of the first type access unit 61 illustrated in FIG. 4. Referring to FIGS. 1-5, during a read operation, each sense amplifier 61-2, which may be implemented as a differential amplifier, senses and amplifies a difference between each data bit output from each data cell 21 via each first type switching circuit 51 and a reference signal V_Ref and outputs each data bit.

During a write operation, each write driver 61-1 transmits each write data bit to each bit line via each first type switching circuit 51. Thus, the write data bit is written to each data cell connected to each selected wordline and each selected bit line.

Figure 6:
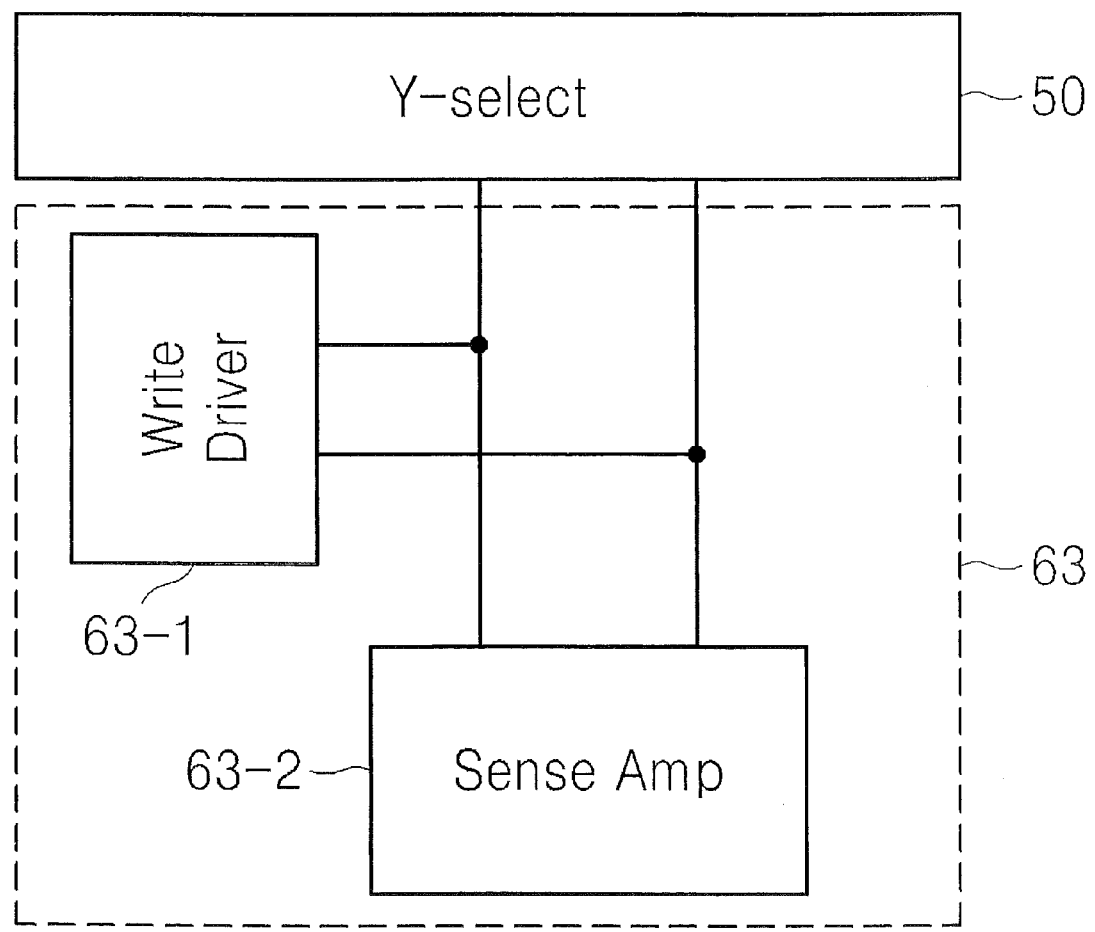
FIG. 6 is a block diagram of an access unit for the semiconductor device illustrated in FIG. 1 according to further embodiments of the present invention.
Figure 7:
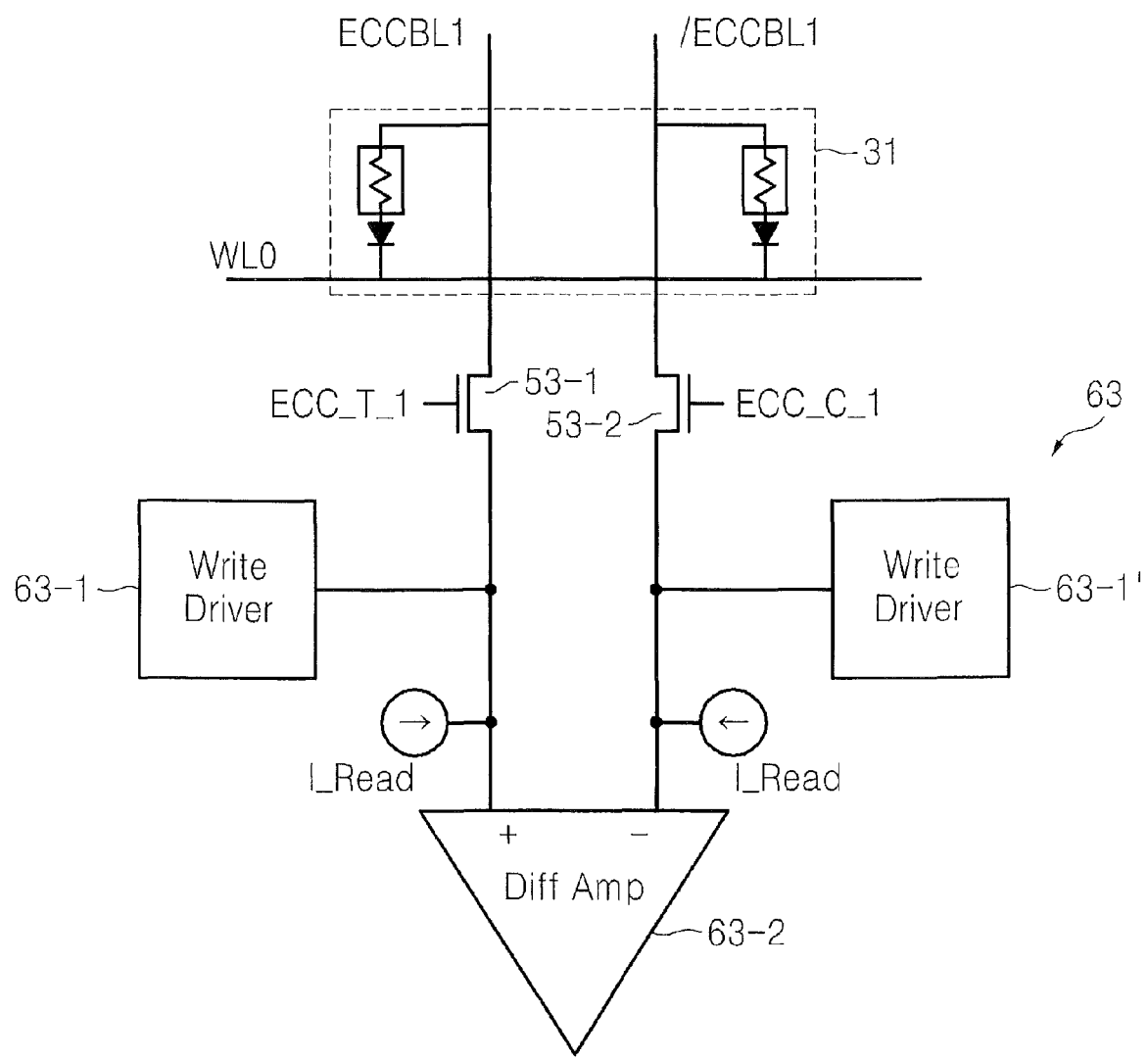
FIG. 7 is a diagram of a circuit implementation of the access unit illustrated in FIG. 6 according to some embodiments of the present invention.

FIG. 6 is a block diagram of each second type access unit 63 illustrated in FIG. 1. FIG. 7 is a circuit diagram of the second type access unit 63 illustrated in FIG. 6. For convenience of explanation, FIGS. 6 and 7 illustrate an ECC memory cell pair 31 connected to a pair of bit lines ECCBL1 and/ECCBL1, a second type switching circuit 53, and a second type access unit 63. Referring to FIGS. 1-3, 6, and 7, during a read operation, a differential amplifier 63-2 may simultaneously receive complementary ECC bits from the ECC memory cell pair 31 via the second type switching circuit 53 and amplify a difference between the received complementary ECC bits, thereby detecting an ECC bit.

During a write operation, a pair of write drivers 63-1 and 63-1' of the second type access unit 63 may sequentially write complementary ECC bits to the ECC memory cell pair 31 by using a pair of switches 53-1 and 53-2.

As illustrated in FIGS. 1 through 7, an ECC bit "1" is written to one ECC memory cell (for example, R1 of FIG. 2 or R3 of FIG. 3) of the ECC memory cell pair 31 when a data bit "1" is written to a data cell 21, and an ECC bit "0" is written to the other ECC memory cell (for example, R2 of FIG. 2 or R4 of FIG. 3) of the ECC memory cell pair 31 when a data bit "0" is written to the data cell 21.

As described above with reference to FIGS. 1 through 7, the semiconductor device 10 may store complementary ECC bits in each ECC memory cell pair 31, and thus may greatly increase the reliability of ECC bits as compared with a conventional semiconductor device that stores each ECC bit in each memory cell.

Figure 8:
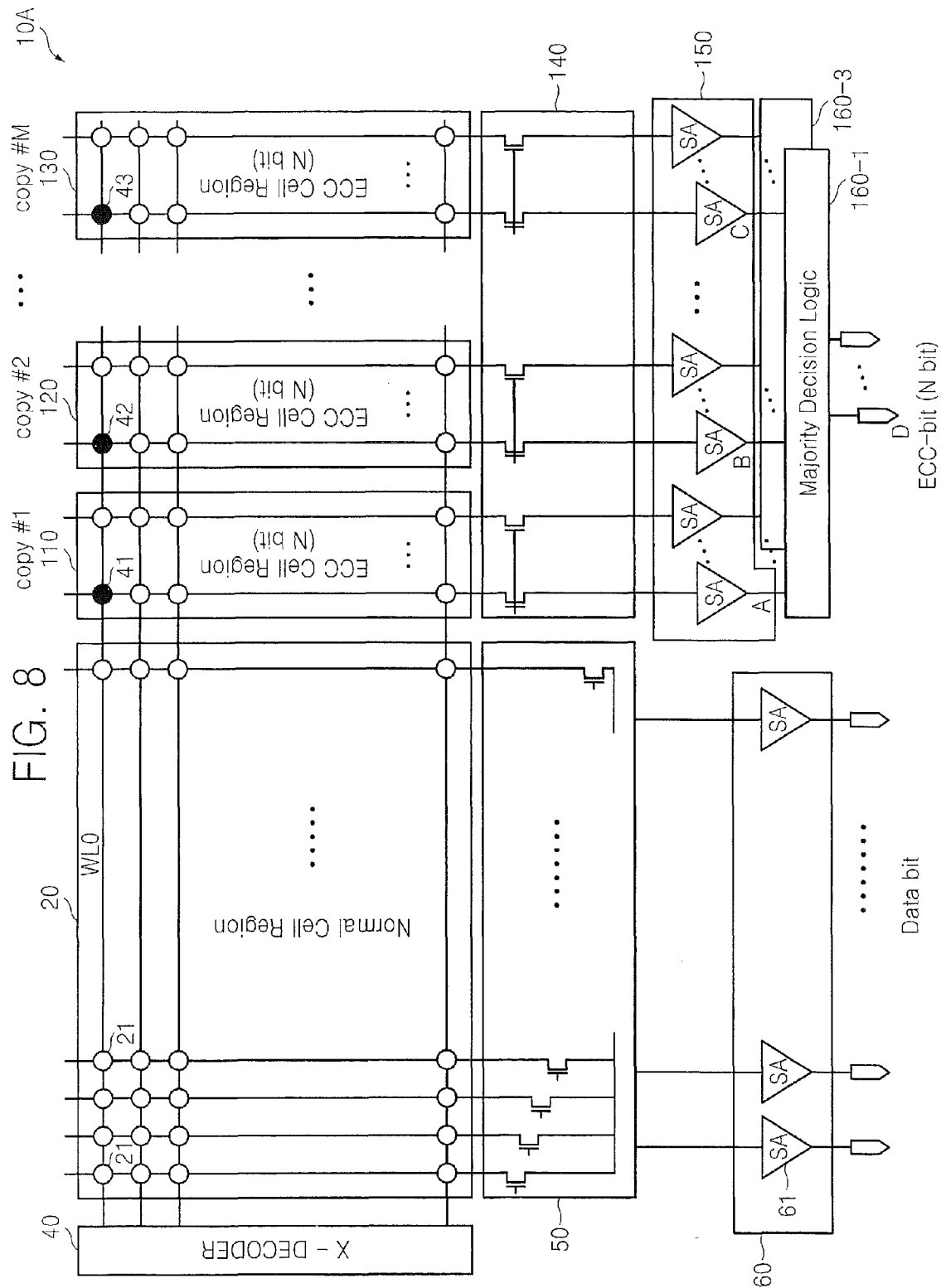
FIG. 8 is a block diagram of a semiconductor device according to some embodiments of the present invention.

FIG. 8 is a block diagram of a semiconductor device 10A according to further embodiments of the present invention. Referring to FIG. 8, the semiconductor device 10A may include a normal cell region 20, a plurality of ECC cell regions 110, 120, . . . , 130, a row decoder 40, a first column decoder 50, a second column decoder 140, a first access block 60, a second access block 150, and a plurality of determination logic circuits 160-1 through 160-3.

The normal cell region 20 may include a plurality of data cells 21 for storing data or data bits. Each of the ECC cell regions 110, 120, . . . , 130 may include a plurality of memory cells for storing ECC bits (hereinafter, referred to as 'ECC memory cells'). Although the ECC cell regions 110, 120, . . . , 130 are separate from one another in FIG. 8, the ECC cell regions 110, 120, . . . , 130 may be incorporated into a single ECC cell region. The number of ECC cell regions may be odd to detect ECC bits under majority rule. However, the semiconductor device 10A according to the present embodiment is not limited to the odd number of ECC cell regions.

The first ECC cell region 110 stores ECC bits corresponding to data bits stored in the normal cell region 20. The second ECC cell region 120 stores ECC bits corresponding to the same data bits of the normal cell region 20 as the same as the ECC bits stored in the first ECC cell region 110. The M-th ECC cell region 130 stores ECC bits corresponding to the same data bits of the normal cell region as the ECC bits stored in the first ECC cell region 110. In other words, the ECC cell regions 110 through 130 stores ECC bits corresponding to the same storage cells of the normal cell region 20.

For example, when data bits are written or programmed to data cells connected to a wordline WL0, ECC bits corresponding to the data bits are written to ECC memory cells that are disposed in the first ECC cell region 110 and connected to the wordline WL0, ECC bits the same as the ECC bits are written to ECC memory cells that are disposed in the second ECC cell region 120 and connected to the wordline WL0, and ECC bits the same as the ECC bits are written to ECC memory cells that are disposed in the M-th ECC cell region 130 and connected to the wordline WL0.

The row decoder 40 and the first column decoder 50 select at least one of the data cells 21 of the normal cell region 20 in response to a first row address and a first column address. The row decoder 40 and the second column decoder 140 select at least one of the ECC memory cells of each of the ECC cell regions 110 through 130 in response to a second row address and a second column address.

The first access block 60 accesses the normal cell region 20 during an access operation. The second access block 150 accesses the ECC cell regions 110 through 130 during an access operation. For example, during an access operation, ECC memory cells 41, 42, and 43 are simultaneously accessed by the second column decoder 140 and the second access block 150. For example, an ECC bit stored in each of the ECC memory cells 41, 42, and 43 may be a least significant bit (LSB) of an n-bit ECC. Alternatively, the ECC bit stored in each of the ECC memory cells 41, 42, through to 43 may be a most significant bit (MSB) of the n-bit ECC.

Each of the determination logic circuits 160-1 through 160-3 receive ECC bits output from the ECC cell regions 110 through 130 and detect an ECC bit under majority rule.

Figure 9:
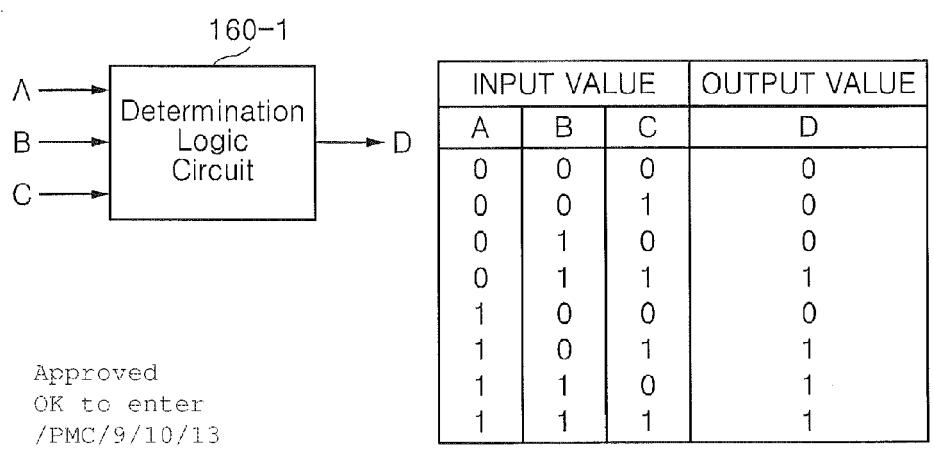
FIGS. 9A and 9B are a block diagram and a truth table illustrating operations of the semiconductor device illustrated in FIG. 8 according to some embodiments of the present invention.
Figure 10:
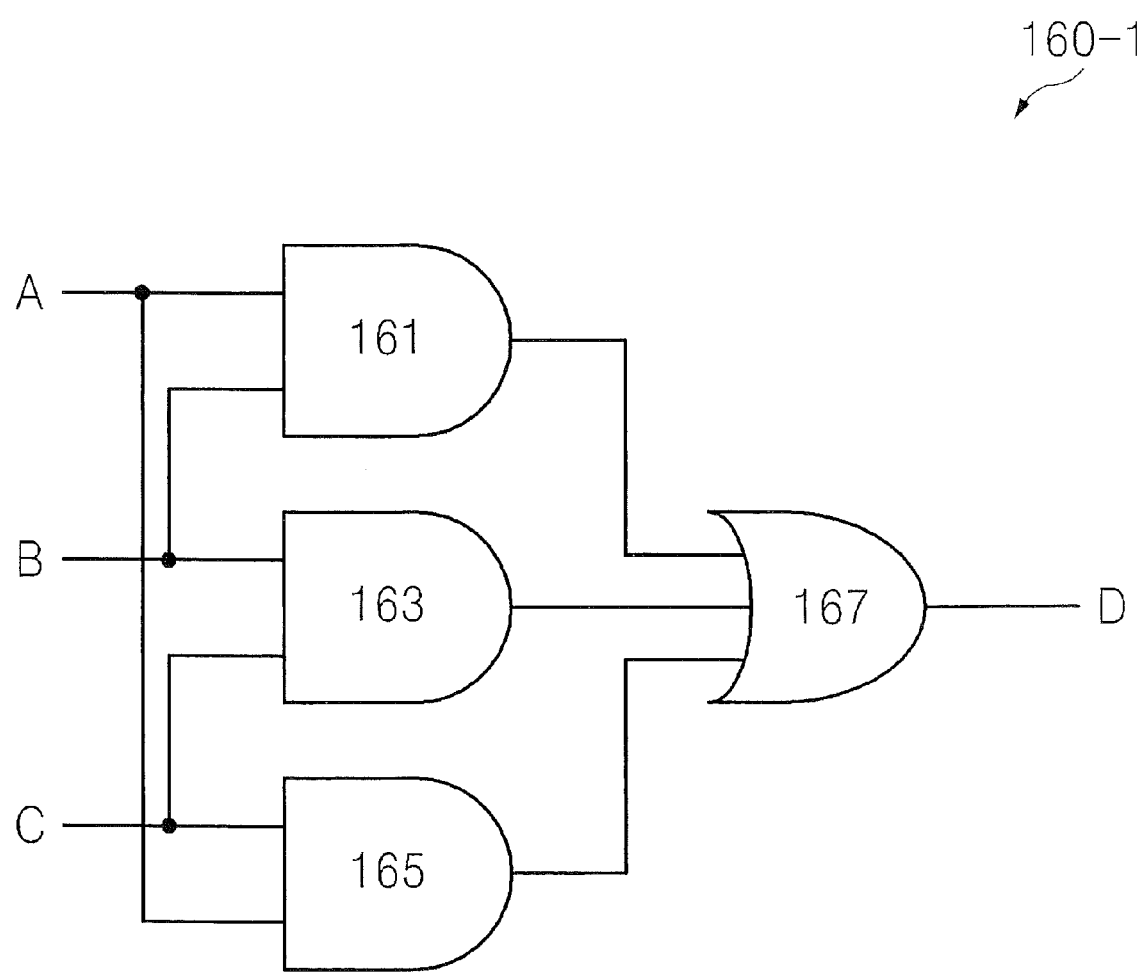
FIG. 10 is a circuit diagram of the determination logic circuit included in the semiconductor device illustrated in FIG. 8.

FIG. 9 illustrates a block diagram and a truth table for conceptually explaining an operation of the determination logic circuit 160-1 illustrated in FIG. 8. FIG. 10 is a circuit diagram of the determination logic circuit 160-1 illustrated in FIG. 8. An operation of the determination logic circuit 160-1 will now be described with reference to FIGS. 8 and 9. For convenience of explanation, it is assumed that each of the ECC memory cells 41, 42, and 43 stores the LSB of an ECC and that 3 ECC cell regions 110, 120, and 130 exist.

The determination logic circuit 160-1 receives a bit A read from the ECC cell 41 of the first ECC cell region 110 and sense-amplified, a bit B read from the ECC cell 42 of the second ECC cell region 120 and sense-amplified, and a bit C read from the ECC cell 43 of the third ECC cell region 130 and sense-amplified. During a write or program operation, the second access block 150 stores the LSBs (for example, the data "1" or the data "0") of ECCs in the ECC cells 41, 42, and 43, respectively, by using the second column decoder 140. Here, the LSBs have identical values. However, the LSBs of the ECCs stored in the ECC cells 41, 42, and 43 may change according to the characteristics of the ECC memory cells 41, 42, and 43.

Thus, the determination logic circuit 160-1 may determine the LSBs of the ECCs under majority rule even when the LSBs of the ECCs stored in the ECC cells 41, 42, and 43 change according to the characteristics of the ECC memory cells 41, 42, and 43. For example, if the bits A, B, and C input to the determination logic circuit 160-1 are 000, 001, 010, or 100, the determination logic circuit 160-1 outputs data 0 as a detected ECC bit D. If the bits A, B, and C input to the determination logic circuit 160-1 are 011, 101, 110, or 111, the determination logic circuit 160-1 outputs data 1 as the detected ECC bit D.

Referring to FIG. 10, the determination logic circuit 160-1 may include 3 AND gates 161, 162, and 163 and an OR gate 167. Each of the AND gates 161, 162, and 163 receive two from among three bits and performs a AND operation on the two received bits. The OR gate 167 receives signals from the NAND gates 161, 162, and 163 and performs an OR operation on the received signals, thereby outputting an ECC's LSB D.

Figure 11:
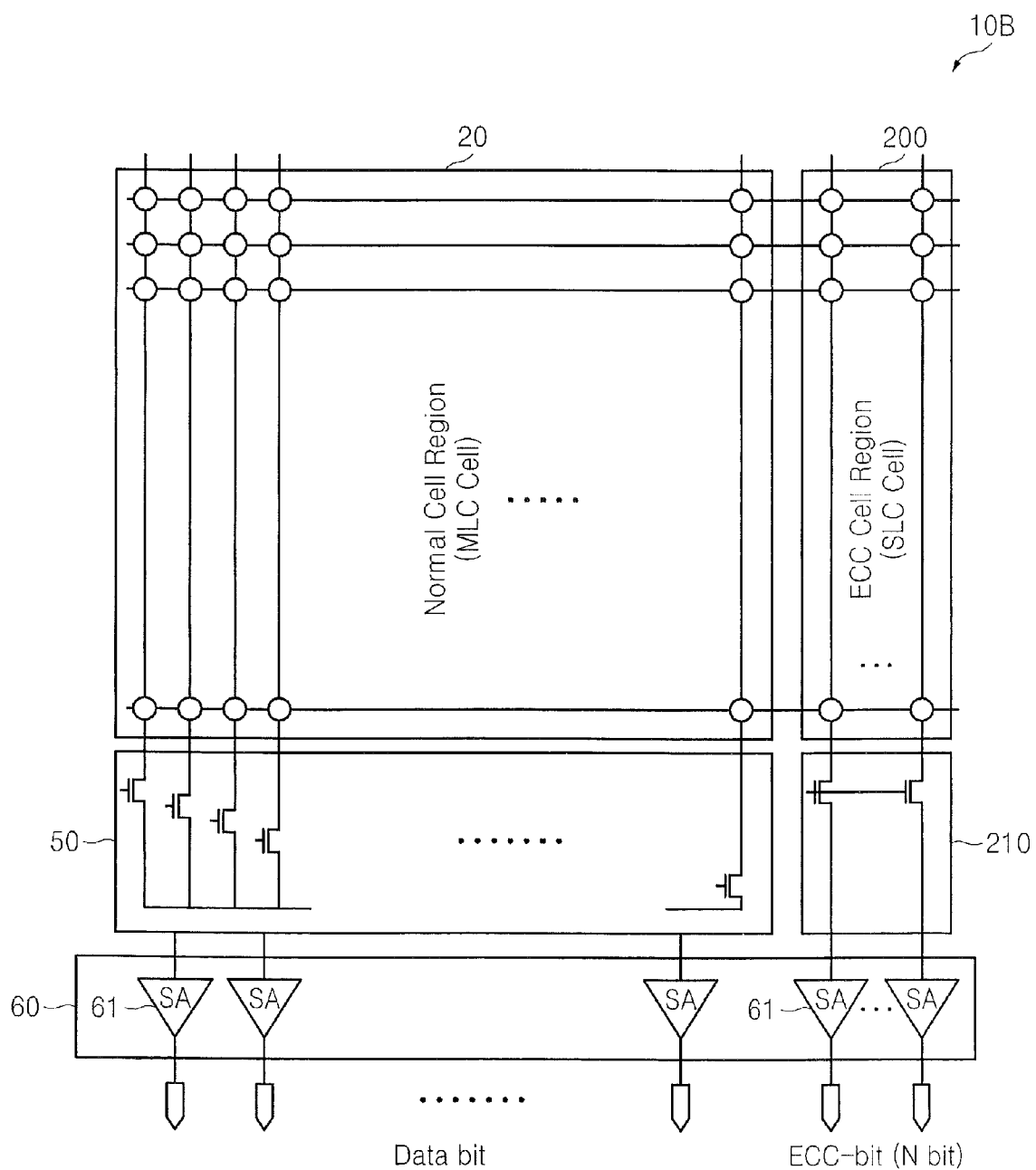
FIG. 11 is a block diagram of a semiconductor device according to some embodiments of the present invention.

FIG. 11 is a block diagram of a semiconductor device 10B according to still further embodiments of the present invention. Referring to FIG. 11, the semiconductor device 10B may include a normal cell region 20, an ECC cell region 200, a first column decoder 50, a second column decoder 210, and an access block 60.

The normal cell region 20 includes a plurality of data cells for storing data. Each of the plurality of data cells may be implemented as an MLC for storing a plurality of bits. The ECC cell region 200 includes a plurality of ECC memory cells for storing ECC bits corresponding to the data stored in the normal cell region 20. Each of the plurality of ECC memory cells may be implemented as an SLC for storing a single bit. If the ECC cell region 200 comprises a plurality of SLCs, the area of the ECC cell region 200 is reduced. FIG. 12 illustrates distributions of the numbers of cells versus resistances of memory cells illustrated in FIG. 11.

Figure 13:
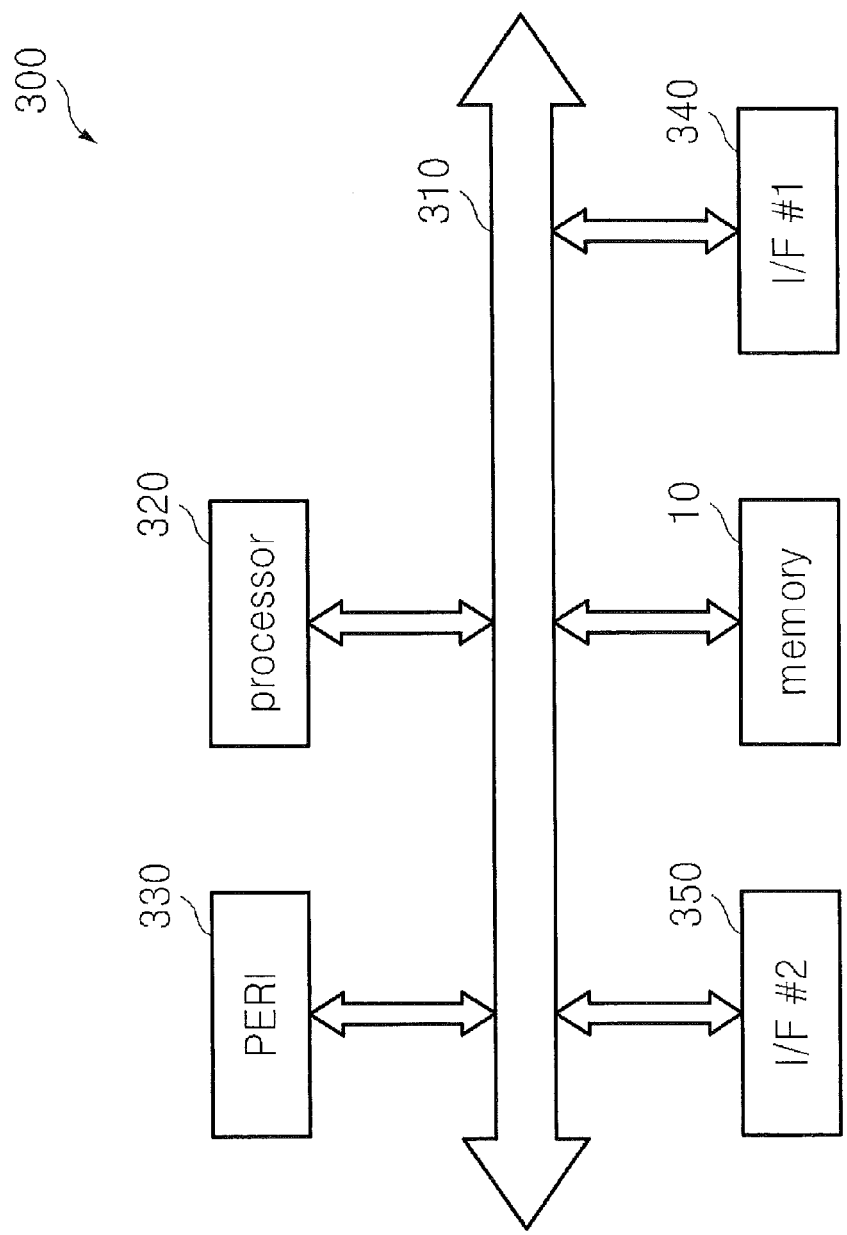
FIG. 13 is a block diagram of a system including a semiconductor device, according to some embodiments of the present invention.

FIG. 13 is a block diagram of a system 300 including a memory 10 (e.g., a semiconductor memory device), according to some embodiments of the present invention. Referring to FIG. 13, the system 300 includes the memory 10 and a processor 320. The processor 320 may control an operation, for example, a program operation, a write operation, a read operation, or an erase operation, of the memory 10 via a bus 310.

The processor 320 may process data received via a first interface 340 such as an input/output device and control the processed data to be written to the memory 10, or process data read from the memory 10 and transmit the processed data to the outside via the first interface 340.

The system 300 may further include a peripheral 330 such as an image pickup device. The image pickup device 330 may be a complimentary metal oxide semiconductor (CMOS) image sensor or a charge-coupled device (CCD) image sensor and may convert a picked-up analog image signal to a digital image signal under the control of the processor 320 and transmit the digital image signal to the memory 10. The first interface 340 may transmit image data stored in the memory 10 to the outside under the control of the processor 320.

The system 300 may further include a second interface 350 such as a wireless communication module. The wireless communication module 350 may process received data according to a built-in signal processing protocol and transmit the processed data to the processor 320 or store the processed data in the memory 10 under the control of the processor 320. Alternatively, the wireless communication module 350 may convert data output from the memory 10 into a wireless signal according to the built-in signal processing protocol and transmit the wireless signal to the outside, under the control of the processor 320.

The system 300 may be implemented as a computer, a hand-held terminal, or consumer equipment (CE). The system 300 may also be implemented as a memory card, a smart card, or a solid state drive (SSD). The hand-held terminal may be a portable computer, a personal digital assistant (PDA), an MP3 player, a portable multimedia player (PMP), an MP4 player, or a game player.

Referring to FIGS. 1 through 7 and 13, the processor 320 outputs data bits and ECC bits corresponding to the data bits to the memory 10. The memory 10 includes the normal cell region 20 and the ECC cell region 30, and stores the data bits output from the processor 320 in the normal cell region 20 and the ECC bits output from the processor 320 in the ECC memory cell pairs disposed in the ECC cell region 30. The memory 10 stores complementary ECC bits in each of the ECC memory cells.

Data processing performed by the processor 320 and the memory 10 may be understood by referring to FIGS. 1 through 13.

Devices, systems and methods according to some embodiments of the present invention may improve the function of recovering fail data by improving the reliability of ECC bits.

While the present invention has been particularly shown and described with reference to exemplary embodiments thereof, it will be understood that various changes in form and details may be made therein without departing from the spirit and scope of the following claims.

What is claimed is:

1. A device comprising:
   a normal cell region comprising a plurality of memory cells and configured to store at least one data bit; and
   a plurality of error correction code (ECC) cell regions comprising a plurality of ECC cells comprising a plurality of groups of at least three ECC cells configured to store identical ECC bits for the at least one data bit; and
   a determination logic circuit configured to generate respective ECC outputs from respective ones of the groups of at least three ECC cells according to a majority voting logic.

2. The device of claim 1, wherein a same word line is connected to a memory cell and a pair of ECC cells corresponding thereto.

3. The device of claim 2, wherein a first one of a given pair of ECC cells is connected to a first bit line and second one of the given pair of ECC cells is connected to a second bit line and where the device further comprises:
   a differential amplifier circuit;
   a first switching circuit configured to connect and disconnect the first bit line to and from a first input terminal of the differential amplifier circuit in response to a first switching signal;
   a second switching circuit configured to connect and disconnect the second bit line to and from a second input terminal of the differential amplifier circuit in response to a second switching signal;
   a first write driver circuit connected to the first input terminal; and a second write driver circuit connected to the second input terminal.

4. The device of claim 1, wherein the ECC memory cells comprise non-volatile memory cells.

5. The device of claim 1, wherein the ECC memory cells comprise resistive memory cells or phase-change random access memory (PRAM) cells.

6. A system comprising:
   a processor configured to produce a data bit and an ECC bit corresponding to the data bit; and
   a memory coupled to the processor and comprising:
   a normal cell region comprising a plurality of memory cells and configured to store at least one data bit;
   a plurality of error correction code (ECC) cell regions comprising a plurality of ECC cells comprising a plurality of groups of at least three ECC cells configured to store identical ECC bits for the at least one data bit; and
   a determination logic circuit configured to generate respective ECC outputs from respective ones of the groups of at least three ECC cells according to a majority voting logic.

7. The system of claim 6, wherein each of the plurality of groups comprises a pair of ECC cells and wherein a same word line is connected to a memory cell and the pair of ECC cells corresponding thereto.

8. The system of claim 7, wherein a first one of a given pair of ECC cells is connected to a first bit line and second one of the given pair of ECC cells is connected to a second bit line and wherein the memory further comprises:
   a differential amplifier circuit;
   a first switching circuit configured to connect and disconnect the first bit line to and from a first input terminal of the differential amplifier circuit in response to a first switching signal;
   a second switching circuit configured to connect and disconnect the second bit line to and from a second input terminal of the differential amplifier circuit in response to a second switching signal;
   a first write driver connected to the first input terminal; and
   a second write driver connected to the second input terminal.

* * * * *